United States Patent [19]

Yokose et al.

[11] Patent Number: 5,577,132
[45] Date of Patent: Nov. 19, 1996

[54] IMAGE CODING/DECODING DEVICE

[75] Inventors: Taro Yokose; Kazuhiro Suzuki; Yutaka Koshi; Koh Kamizawa, all of Kanagawa, Japan

[73] Assignee: Fuji Xerox Co., Ltd., Tokyo, Japan

[21] Appl. No.: 363,324

[22] Filed: Dec. 23, 1994

[30] Foreign Application Priority Data

Dec. 27, 1993 [JP] Japan ................................ 5-331119

[51] Int. Cl.$^6$ ........................................................ H03M 7/00
[52] U.S. Cl. ........................ 382/238; 382/247; 341/107; 358/467
[58] Field of Search ................................ 341/107, 51, 65, 341/67; 358/539, 467; 382/238, 247, 239

[56] References Cited

U.S. PATENT DOCUMENTS

| | | | |
|---|---|---|---|
| 5,023,611 | 6/1991 | Chamzas et al. | 341/51 |
| 5,406,282 | 4/1995 | Nomizu | 341/65 |
| 5,414,423 | 5/1995 | Pennebaker | 341/107 |
| 5,416,606 | 5/1995 | Katayama et al. | 358/467 |
| 5,422,734 | 6/1995 | Kang | 358/429 |
| 5,442,458 | 8/1995 | Rabbani et al. | 358/426 |

OTHER PUBLICATIONS

Hiroshi Yasuda, "International Standard for Multi-Media Coding," (Japanese) published by Maruzen Co., Ltd., pp. 80-81.

Shigeo Kato and Yasuhiko Yasuda, "A State Degeneration Method for Source Encoding of Multi-Level Images," (Japanese), The Institute of Electronics, Information and Communication Engineers, Technical Report, IE80-108, pp. 1-6.

Imanaka et al., "High-Efficiency Coding Method of High--Tone Image," (Japanese), The '82 Institute of Electronics and Communication Engineers, Communication Section, National Convention S3-8, pp. 433-434.

IBM Journal of Research and Development, vol. 32, No. 6, Nov. 1988, p. 754.

*Primary Examiner*—Jeffrey A. Gaffin
*Assistant Examiner*—Jason L. W. Kost
*Attorney, Agent, or Firm*—Finnegan, Henderson, Farabow, Garrett & Dunner, L.L.P.

[57] ABSTRACT

An image coding device for coding an input image of multi-level. In the image coding device, an input multi-level image is analyzed by an image analyzing portion, and update information to be used when a probability estimation value is generated is generated by an update value determining portion on the basis of adjoining pixel information as a result of the analysis by the image analyzing portion. Further, a probability estimation value is generated by a probability estimating portion on the basis of the update information generated by the update value determining portion and the result of the analysis by the image analyzing portion, and the input multi-level image is arithmetically coded by a code word generating portion on the basis of the probability estimation value generated by the probability estimating portion.

24 Claims, 11 Drawing Sheets

|  | MARKED PIXEL | ADJOINING PIXEL 1 | ADJOINING PIXEL 2 | ADJOINING PIXEL 3 |
|---|---|---|---|---|
| GENERATED STATE | 30 | 0 | 29 | 255 |
| "CIRCUMJACENCE" OF d = 1 | <u>29</u> | 0 | 29 | 255 |
| ↑ | <u>31</u> | <u>0</u> | 29 | 255 |
| ↑ | 30 | <u>1</u> | 29 | 255 |
| ↑ | 30 | 0 | <u>28</u> | 255 |
| ↑ | 30 | 0 | <u>30</u> | 255 |
| ↑ | 30 | 0 | 29 | <u>254</u> |

(NUMERALS INDICATE PIXEL VALUES (POSITIVE NUMBER OF 8 BITS))

FIG. 8

| STATE DATA | | | |
|---|---|---|---|
| MARKED PIXELS | CONTEXT DATA | | |
| | ADJOINING PIXEL 1 | ADJOINING PIXEL 2 | ... |
| xxxx | xxxx | xxxx | ... |

FIG. 9

PIXEL VALUE OF MARKED PIXEL

| CONTEXT | 0 | 1 | ... | N | ... |
|---|---|---|---|---|---|
| 0 | xxxx | xxxx | ... | xxxx | ... |
| 1 | xxxx | xxxx | ... | xxxx | ... |
| ⋮ | ⋮ | ⋮ | ⋮ | ⋮ | ⋮ |
| M | xxxx | xxxx | ⋮ | xxxx | ⋮ |
| ⋮ | ⋮ | ⋮ | ⋮ | ⋮ | ⋮ |

▨ : PROBABILITY ESTIMATION DATA CORRESPONDING TO CONTEXT M

FIG. 10

| | UPDATE DATA | | |
|---|---|---|---|
| $\Delta n(y)$ | STATE DATA GROUP | | |
| | STATE DATA 1 | STATE DATA 2 | ... |
| xxxx | xxxx | xxxx | ... |

IMAGE CODING/DECODING DEVICE

BACKGROUND OF THE INVENTION

1. Field of the Invention

The present invention relates to an image coding device, and more particularly to a reversible coding method for coding an input image of multi-level.

2. Discussion of the Related Art

The arithmetic coding method, which is a kind of the entropy coding method, is a high-efficiency coding method in which as input data increases, the coding efficiency asymptotically approaches to the entropy. An example actually using the arithmetic coding method is JBIG (Joint Bi-level Image Experts Group) as the international standard of the bi-level reversible coding method. In the JBIG, the coding efficiency is improved by additionally incorporating the state sorting technique using adjoining pixels into the arithmetic coding method.

According to the conventional rules, the combination of pixel value or values of adjoining pixel or pixels is referred to as "context". The combination of the context and the pixel values of marked pixels is referred to as "circumjacent state".

Generally, the term "arithmetic coding method" indicates a coding method handling binary or bi-level data. With recent progressive advancement of the image processing technique, there is an increasing demand of developing the coding methods for the multi-level image processing. In this circumstance, designers are constantly under pressure of developing the applications of the arithmetic coding method to the multi-level image processing.

Before the multi-level image is compressed by an ordinary arithmetic coding method, the multi-level image must be converted into two-level data (see "INTERNATIONAL STANDARD FOR MULTI-MEDIA CODING", p. 80, written by Hiroshi Yasuda, published by Maruzen Co., Ltd.). A bit plane method, for example, may be used for this preprocessing for the binarizing process of the multi-level data. In the bit plane method, the multi-level image is converted into two-level data by slicing the multi-level image every data.

Meanwhile, it is known that in compressing the multi-level image data, the coding method which handles the image data as multi-level image provides a higher coding efficiency than the method which slices the image data into bit planes (see the above article, "INTERNATIONAL STANDARD FOR MULTI-MEDIA CODING", p. 80).

A coding method constructed by extending the arithmetic coding method so as to handle the multi-level image as intact is proposed (see the above article, "INTERNATIONAL STANDARD FOR MULTI-MEDIA CODING", p. 81). In the bi-level arithmetic coding method, codes are produced by dividing the number line into two equal segments. The extension of the arithmetic coding method may readily be realized by dividing the number line into equal segments of more than two.

However, when the arithmetic coding method is applied for the coding of the multi-level image, some problems arise. These problems will be described. The first problem follows.

1) High computing accuracy is required.

This arises from the increase of the number of divisions of the number line. A computing accuracy attained by an ordinary computer suffices for the computing accuracy required for the arithmetic coding method. However, this is problematic where a high processing speed is required at the sacrifice of the computing accuracy. This problem will be solved with the advanced hardware technology. Hence, no further discussion thereof will be given here.

Second and third problems arise from the fact that in the multi-level arithmetic coding method, the number of circumjacent states is considerably increased when comparing with the bi-level arithmetic coding method. The approach using the adjoining pixels is indeed an effective means to improve the coding efficiency. However, when the number of adjoining pixels is increased, the number of circumjacent states is greatly increased. In JBIG, ten adjoining pixels are used, and these are quartered. Circumjacent states of $2^2=4$, 096 are used. If the same is correspondingly applied to the 8-bit image, the number of circumjacent states is approximately $8 \times 10^{28}$. The number of circumjacent states for the bi-level arithmetic coding method and that for the multi-level arithmetic coding method are comparatively tabulated in Table 1. In the table, "dpi" is the abbreviation of dot per inch.

TABLE 1

| Coding method | Bi-level arithmetic coding | | | Multi-level arithmetic coding | | No. of pixels of A4 | |
|---|---|---|---|---|---|---|---|
| No. of adjoining pixels | 0 | 10 | JBIG | 0 | 2 | 200 dpi | 400 dpi |
| No. of circumjacent states (No. of pixels) | 2 | 2048 | 8192 | 256 | *17 × 10⁶ | *3.5 × 10⁶ | *14 × 10⁶ |

*: Approximately

The following two problems may be enumerated for the specific problems arising from the increase of the circumjacent states.

2) A large-capacity memory is required corresponding to the number of circumjacent states.

3) It is difficult to estimate a probability of occurrence of each circumjacent state.

For the problem 2), since the number line is divided in accordance with an occurrence probability of each state, a memory for storing the occurrence probabilities of the circumjacent states is required. The problem 3) arises from the fact that the number of circumjacent states is considerably large when comparing with the image data as input data.

In the study on the multi-level arithmetic coding method, the approach to reduce the total number of circumjacent states by omitting the circumjacent states having less influence has been employed by most of research workers. The operation to reduce the total number of circumjacent states by omitting the circumjacent states having less influence is referred to as "degeneration". If the degeneration of the number of circumjacent states is realized, both the problems 2) and 3) could be solved because these problems arise from the excessive number of circumjacent states. For the study based on this inference, reference is made to "A State Degeneration Method for Source Encoding of Multi-Level Images" by Kato and Yasuda, The Institute of Electronics, Information and Communication Engineers, Technical Report, IE80-108.

The degeneration of circumjacent states goes against the approach to improve the coding efficiency by increasing the number of circumjacent states. It would be estimated that the degeneration has the following problems.

Degradation of the coding efficiency would be unavoidable in principle although a degree of the coding efficiency reduction depends on the degeneration method used.

In the approach in which parameters for the degeneration are determined depending on the image, as in the above article, "A State Degeneration Method for Source Encoding of Multi-Level Images", a load to the degeneration process is large.

The dependency of the coding efficiency on the image may be problematic in the degeneration system of the fixed type, described by Imanaka et al., in their paper "High-Efficiency Coding Method of High-Tone Image", The '82 Institute of Electronics and Communication Engineers, Communication Section, National Convention S3-8.

Therefore, it is ideal to realize the multi-level arithmetic coding method without degeneration. It is expected that the problem 2) will be solved with advancement of hardware technology, as of the problem 1). The basic problem hindering the realization of the multi-level arithmetic coding method resides in the problem 3) of the probability estimation. Let us consider the problem 3) of the probability estimation.

The formula of estimating the occurrence probability will first be described. The conventional technique estimates the occurrence probability of each circumjacent state by using the number of occurrences of the circumjacent state in the processed data. In the simplest example, an occurrence probability of the circumjacent state can be estimated by the following expression.

$$P_{est}(a) = n(a)/\sum_i n(i) \qquad (1)$$

In the above expression, $n(a)$ represents the number of occurrences of the circumjacent state up to the present time. In the denominator on the right side, all the existing circumjacent states are summed.

Some other probability estimating methods than the above one exist. In the document of the JBIG, a formula called the estimation of Bayes is described (ISO/IEC 11544, Annex D).

$$P_{est}(a) = (n(a) + \delta)/\sum_i (n(i) + \delta) \qquad (2)$$

where $\delta$ represents a constant between 0 and 1. What is actually used in JBIG is a probability transition obtained referring to a predetermined transition table.

The reason why degradation of an accuracy of the estimation of the occurrence probability leads to the low coding efficiency in the arithmetic coding method, will be described.

[Average code length and probability estimation in the arithmetic coding method]

When the occurrence probabilities for symbols a, b, ... 2x are estimated by dividing the numbers of occurrences $n(a), n(b), \ldots, n(x)$ by a data length n, viz., using the formula (1), an average code length B in the arithmetic coding method is expressed by the following expression.

$$B=[n(a)\log_2(n(a)/n)+n(b)\log_2(n(b)/n)+\ldots+n(x)\log_2(n(x)/n]/n \qquad (3)$$

where [ ] indicates the operation of raising fractions to unit. A theoretical value $B_{th}$ representative of the lower limit of the average code length B may be expressed by the entropy according to Shannon's formula.

$$B_{th}=p(a)\log_2 p(a)+p(b)\log_2 p(b)+\ldots+p(x)\log_2 p(x) \qquad (4)$$

where p(a) represents a theoretical value of the occurrence probability of a circumjacent state a.

From the above description, it is seen that as the probability estimation contained in the right side of the expression (3) is more exact, the coding efficiency asymptotically approaches to a value given by the expression (4), viz., the theoretical value. Conversely, if the accuracy of the probability estimation is degraded, the average code length B increases. Where the input data is stationary, viz., the probability distribution little varies, the probability estimation by the expression (3) can be done relatively exactly.

A coding device based on the conventional arithmetic coding method by using the estimation method of the expression (1) or (2) will be described. In FIGS. 15 (a) and 15 (b) showing the arrangement of a conventional arithmetic coding/decoding system, FIG. 15 (a) shows a coding device and FIG. 15 (b) shows a decoding device. The illustrated arithmetic coding/decoding system is the arithmetic coding/decoding system, somewhat modified, that is disclosed in "IBM Journal of Research and Development" Vol. 32-No. 6(1988), p.754-FIG. 1. In the figure, reference numeral 10 designates an image input portion; 20, an image analyzing portion; 30, a probability estimating portion; 40, a code word generating portion; 50, a code output portion; 70, a code input portion; 80, a code word analyzing portion; 90, an image output portion; 110, image data; 120, pixel value data; 130, circumjacent state data; 140, probability estimation data; 150, code word data; 210, code data; and 220, pixel value data.

The details of the arithmetic coding/decoding system shown in FIGS. 15 (a) and 15 (b) will be described. The coding device of FIG. 15 (a) is arranged in the following. The image input portion 10 receives incoming input image data, and outputs it as image data 110 to the image analyzing portion 20. The image analyzing portion 20 receives the image data 110, and transfers a pixel value of a pixel to be coded or a marked pixel as pixel value data 120 to the code word generating portion 40. The same also transfers a pixel value of an adjoining pixel as circumjacent state data 130 to the probability estimating portion 30. The probability estimating portion 30 receives the circumjacent state data 130, and transfers probability estimation data 140, which corresponds to the circumjacent state data 130, to the code word generating portion 40, and then updates the probability estimation data retained therein. The code word generating portion 40 generates a code word by using the probability estimation data 140 and the pixel value data 120, and transfers the generated code word as code word data 150 to the code output portion 50. The code output portion 50 outputs the code word data 150 as output code signal.

Next, the details of the decoding device shown in FIG. 15 (b) will be described. In the description, like or equivalent portions will be designated by like reference numerals in FIG. 15 (a) showing the coding device, with omission of description of the details thereof. The code input portion 70 receives an incoming input code signal, and transfers it as code data 210 to the code word analyzing portion 80. The code word analyzing portion 80 decodes the code data 210 by using probability estimation data 140 coming from the probability estimating portion. Then, it transfers the pixel value data 220 as the decoding result to the image output portion 90. The image output portion 90 outputs the pixel value data 220 as output data, while at the same time transfers image data 110 to the image analyzing portion 20.

The operations of the arithmetic coding/decoding system thus constructed will be described. FIGS. 2 (a) and 2 (b) are flowcharts showing the operations of the coding device of FIG. 15 (a) and the decoding device of FIG. 15 (b), respectively. In the figures, the portions enclosed by dotted lines are common to the coding procedure and the decoding procedure. FIG. 16 shows a flowchart showing step S60.

The coding process will first be described with reference to FIG. 2 (a). In step S10, the image input portion 10 performs an image input process. The input result is converted into image data 110, and transferred to the image analyzing portion 20. In step S20, the image analyzing portion 20 combines the pixel value or values of a predetermined adjoining pixel or pixels to determine a context. In step S30, a pixel value of a marked pixel is added to the context determined in step S20, thereby forming circumjacent state data 130, and the result or the circumjacent state data 130 is transferred to the probability estimating portion 30. The probability estimating portion 30 transfers the probability estimation data 140 to the code word generating portion 40 on the basis of the data of the context contained in the circumjacent state data 130. In step S40, the code word generating portion 40 generates code word data 150 using the circumjacent state data 130 and the pixel value data 120, by the arithmetic coding method. In step S50, the code output portion 50 outputs code data to exterior.

The process in step S60 will be described with reference to FIG. 16. In step S210, the probability estimation data (stored in the probability estimating portion 30) corresponding to the circumjacent state data 130 is updated by using the expression (1), for example. If required, another probability estimation data is also updated. For example, where the probability estimation data per se is retained in the probability estimating portion 30, when the estimation by the expression (1) is used, another circumjacent state of the same context must be updated.

In step S70, if all the input image data 110 have been coded, the process ends. If not yet coded, the process flow returns to step S10.

The decoding process will be described with reference to FIG. 2 (b). The same portions as those in the coding process will not be described. In step S110, the code input portion 70 executes a code input process. The input result is converted into code data 210, and the code data is transferred to the code word analyzing portion 80. Step S20 is the same as the corresponding one in the coding process except that the image data 110 for determining the context is received from the image output portion 90. In step S140, the code word analyzing portion 80 generates pixel value data 220 using the probability estimation data 140 and the code data 210, by an arithmetic decoding method. In step S150, the image output portion 90 outputs pixel value data 220 to exterior, while at the same time transfers it as image data 110 to the image analyzing portion 20. In step S170, if all the code data 210 have been coded, the process ends. If not yet coded, the process flow returns to step S110.

In the above operation, the determining of the context in step S20 is carried out using a predetermined adjoining pixel.

The conventional arithmetic coding/decoding system thus arranged cannot keep the required accuracy of the probability estimation when the number of circumjacent states is increased. The reason for this will be described hereinafter. In the multi-level arithmetic coding system, the number of input data is extremely small when comparing with the number of circumjacent states, as already described. From the withstand of the probability estimation, the cause of this can be described such that the processing of the input data ends a probability distribution is settled down in a stationary state. In usual language, it can be described such that the data processing per se ends before the processed data is statistically processed to such an extent as to estimate an occurrence probability of unprocessed data groups from the result of the statistically processed data.

From the above description, it is seen that in a case where an excessive number of circumjacent states exists, viz., a stationary state is not set up in the input data, it is impossible to obtain a good probability estimation when the conventional arithmetic coding method is used. As a consequence, it is safe to say that the solution to this problem is to speed up the processing of the probability estimation.

Thus, the problem on the probability estimation, particularly the speed-up of the processing, is the most serious obstacle in realizing the multi-level arithmetic coding system.

SUMMARY OF THE INVENTION

Accordingly, an object of the present invention is to solve the problems of the conventional system and to provide a multi-level reversible coding system with a high efficiency.

In order to attain the above object, the present invention provides an image coding device including: image analyzing means for analyzing an input multi-level image; update value generating means for generating update information to be used when a probability estimation value is generated on the basis of adjoining pixel information as a result of the analysis by the image analyzing means; probability estimating means for generating a probability estimation value on the basis of the update information generated by the update value generating means and the result of the analysis by the image analyzing means; and code word generating means for arithmetically coding the input multi-level image on the basis of the probability estimation value generated by the probability estimating means.

BRIEF DESCRIPTION OF THE DRAWINGS

FIG. 8 is a table showing an example of the expression of state data in the embodiment;

FIG. 9 is a table showing an example of the expression of probability estimation data in the embodiment;

FIG. 10 is a table showing an example of the expression of update data in the embodiment;

DETAILED DESCRIPTION OF THE PREFERRED EMBODIMENTS

Figure 1:
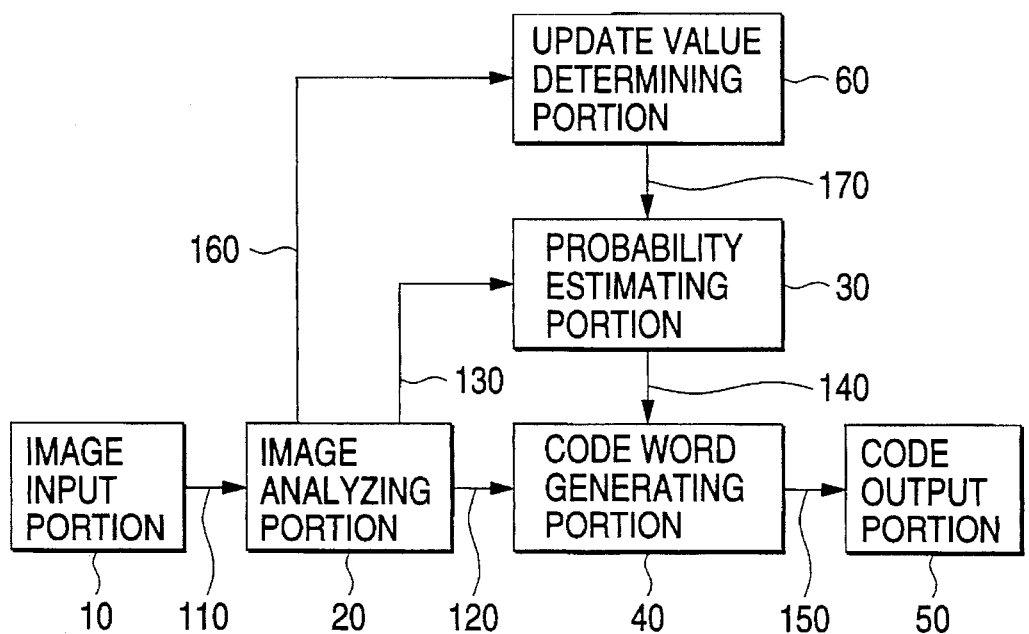
FIGS. 1 (a) and 1 (b) are block diagrams showing the technical concept of the present invention.
Figure 1:
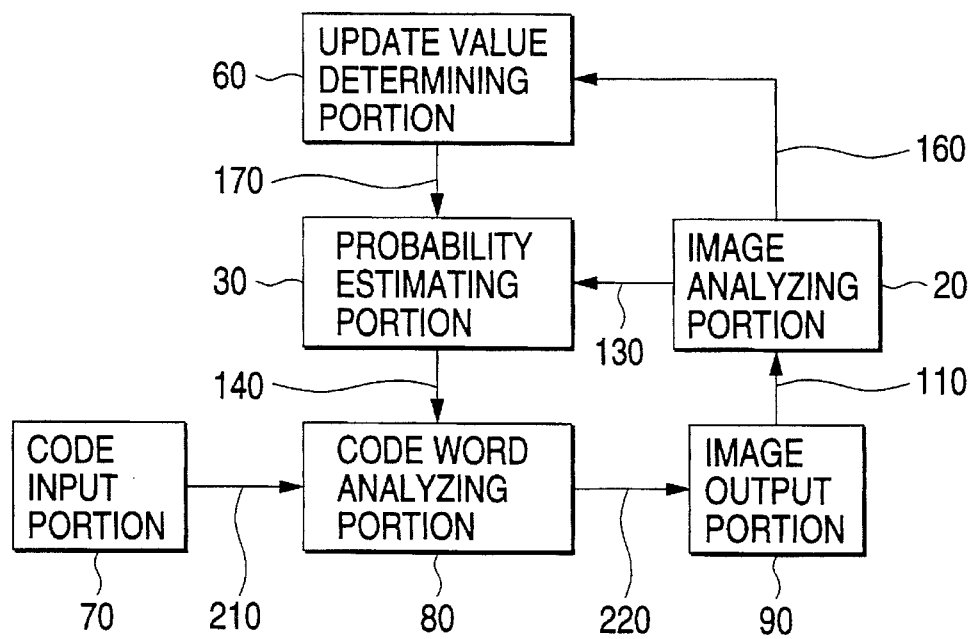

FIGS. 1 (a) and 1 (b) are block diagrams showing the technical concept of the present invention. For simplicity, like or equivalent portions will be designated by like reference numerals in the figures used for the conventional art description of the conventional system. In the figures, reference numeral 60 designates update value determining portion; 160, circumjacent state data; and 170, update data.

The details of the arrangement of FIGS. 1 (a) and 1 (b) will be described, placing an emphasis on only the portions different from those of the conventional system. The update value determining portion 60 selects probability estimation data that seems to be updated, from among the probability estimation data stored in the probability estimating portion 30, and transfers information on the selection as update data 170 to the probability estimating portion 30. The probability estimating portion 30, as in the conventional system, transfers probability estimation data 140 to the code word generating portion 40, and then updates the probability estimation data corresponding to the circumjacent state data 160 and probability estimation data specified by the update data 170.

A process by the update value determining portion 60 will be described. A state that the correlation of an occurrence probability is high is defined as "circumjacence". Various conditions for the "circumjacence" exist. Examples of these are a state where pixels have near pixel values, and a state that pixel value differences of pixels and a market pixel are equal. The definition may be altered by the input image.

When a state occurs in input data, its "circumjacence" will be observed in course of time by the definition of the "circumjacence". Accordingly, also for the "circumjacence", it is desirable to update their occurrence probability data. A process to determine probability estimation data to be updated, the way of updating, and its value under such a rule is the process carried out by the update value determining portion 60.

Figure 2:
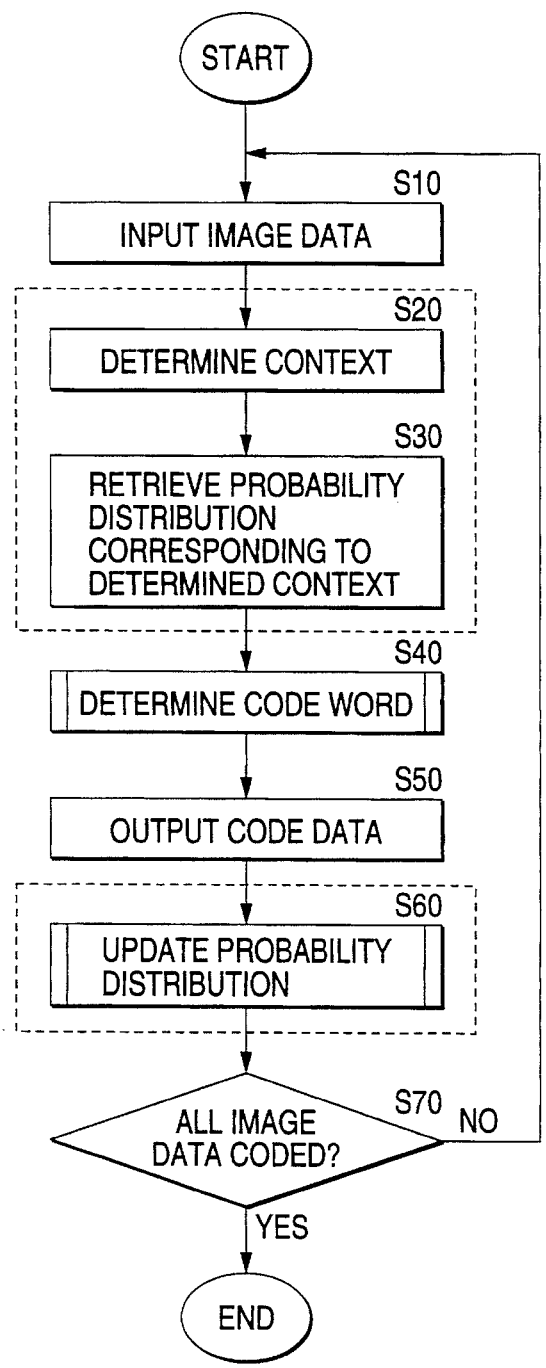
FIGS. 2 (a) and 2 (b) are flowcharts showing the operation of the present invention.
Figure 2:
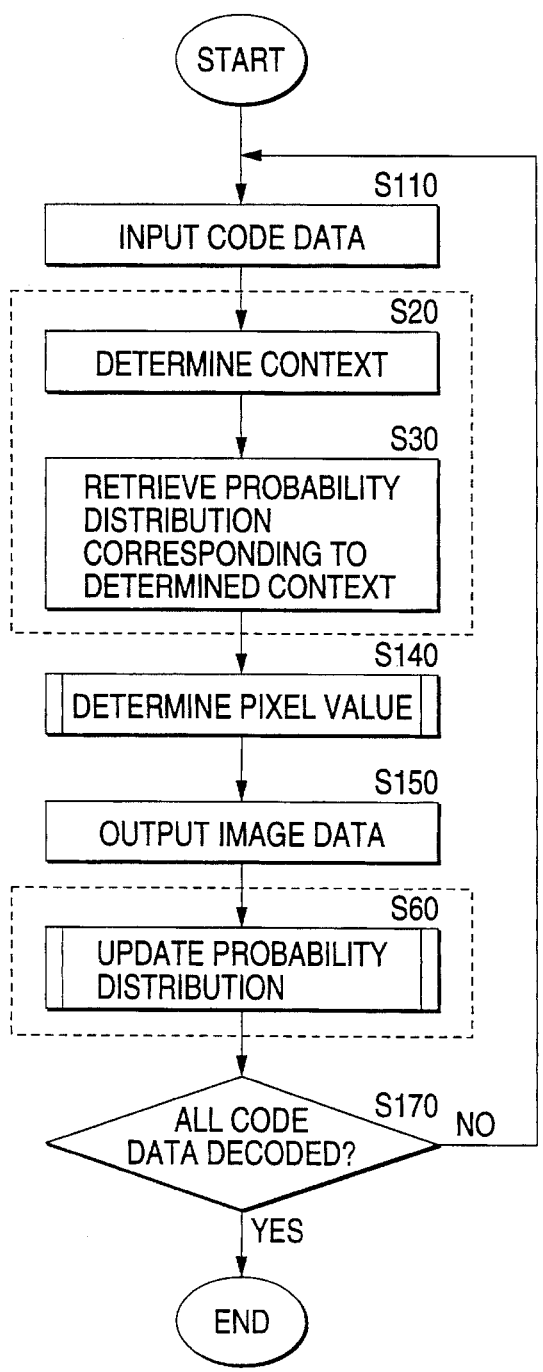
Figure 3:
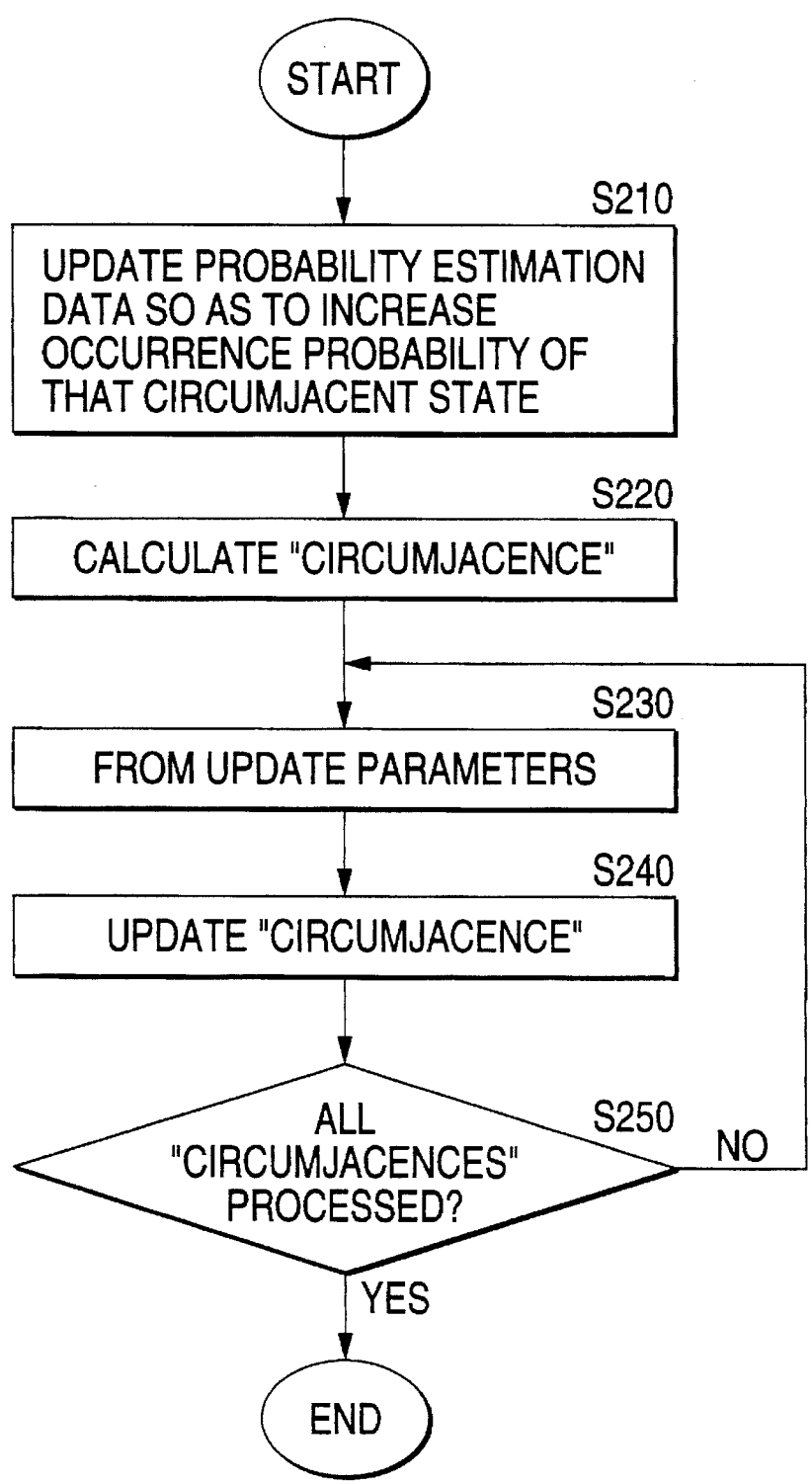
FIG. 3 is a flowchart showing the operation of the present invention.

FIGS. 2 (a) and 2 (b) are flowcharts showing the basic operations of a coding device and a decoding device according to the present invention. The portions enclosed by dotted lines are common to the coding procedure and the decoding procedure. FIG. 3 shows a flowchart showing step S60. The operations of the coding and the decoding devices will be described with reference to the flowcharts. In the figures, an updating process of the probability distribution is denoted as S60 in both the conventional system and the present embodiment, for ease of explanation. However, as will be apparent from the description to be given below, the contents of the updating process of the probability distribution of the conventional system are different from those of the present invention.

In the process, other procedural steps than step S60 are the same as those in the conventional system. Hence, only step S60 will be described with reference to FIG. 3. In step S210, the probability estimating portion 30 updates the probability estimation data corresponding to "circumjacence" data 160 as in the conventional system, and with the updating, updates necessary other probability estimation data. In step S220, the update value determining portion 60 calculates the "circumjacence" of the circumjacent state data 160 by a predetermined method. In step S230, the update value determining portion 60 determines the way of updating circumjacent data and its value, and transfers the result of the determination as update data 170 to the probability estimating portion 30. In step S240, the probability estimating portion 30 updates the data in accordance with the update data 170 that comes from the update value determining portion 60. In step S250, if all the circumjacent states have been processed, the process of step S60 ends. If there is at least one circumjacent state not yet processed, the flow returns to step S230.

The present invention enables the occurrence probabilities of some circumjacent states to be updated for one input data. Therefore, if the definition of the circumjancence is in conformity with the nature of the input data, the estimation process of the occurrence probability would be sped up. In consequence, the coding efficiency in the multi-level arithmetic coding is improved.

An embodiment of the present invention in which the circumjancence of data is defined in terms of the sum total of the pixel value differences between marked pixels and between adjoining pixels, will be described.

In an image of high continuity, such as a natural image, if the pixel value of one of the marked pixels for adjoining pixels is improper, the occurrence probability will be little varied. The same thing is true for the pixel values of the adjoining pixels.

An interrelation among such circumjacent states that the sum total of the differences between the pixel values of adjoining pixels or marked pixels falls within a predetermined range, is defined as "circumjancence". It is assumed that two adjoining pixels A and B are present and one marked pixel X is present. In the expression of the pixel values of pixels where circumjacent states are written as subscripts, if circumjacent states x and y satisfy the following condition $$D(x,y)=|A_x-A_y|+|B_x-B_y|+|X_x-X_y|\leq d, \ (d>0) \tag{5}$$

the circumjacent states x and y are called "circumjancence". In the above expression, d is a positive constant. Specific examples of the circumjacent states when 8 bits are used for expressing one pixel and three adjoining pixels are present are tabulated in FIG. 4.

The following presumption is made on the basis of the proper definition of "circumjancence".

[Presumption]

The difference between the occurrence probabilities of the "circumjancence" may be restricted by the product of a small positive value and an occurrence probability that is larger.

This presumption may mathematically be expressed by the following expression.

$$|p(x)-p(y)| \leq \alpha \cdot \max(p(x),p(y)) \quad (0 \leq \alpha \leq 1) \tag{6}$$

Figures 4, 5:
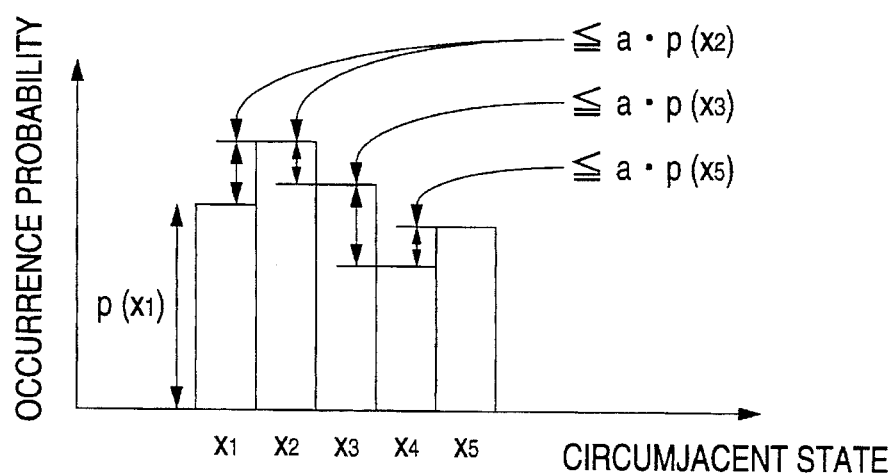
FIG. 4 is a table showing the concept of "circumjancence" in the embodiment.
FIG. 5 is an explanatory diagram showing the concept of the presumption in the embodiment.

In the above expression, x indicates a circumjacent state and y indicates its "circumjancence", and p(x) and p(y) are occurrence probabilities of them, respectively. α is a constant. FIG. 5 shows the conditions of the expression (6). In the figure, the circumjacent states are rearranged so that those of "circumjancence" are adjacent to each other.

What probability estimation is possible under this presumption will be described. The reasonability of the presumption will be described later.

Assuming that the sum of piece of input data is n, and the occurrence probabilities of the circumjacent states x and y are n(x) and n(y), then the expression (6) can be arranged into $$|n(x)-n(y)|/n \leq \alpha \cdot \{\max(n(x),n(y))\}/n \tag{7}$$

where n is the sum total of the occurrence probabilities of the circumjacent states. Then, the expression (7) may be rearranged into the following expression.

$$|n(x0-n(y)| \leq \alpha \cdot \max(n(x),n(y)) \tag{8}$$

From this, it is seen that when the circumjacent state x occurs n(x) times, the circumjacent state y occurs at a frequency within the range defined by the expression (8).

As seen the consideration thus far made, it is desirable to use such an algorithm that when the circumjacent state x occurs, the occurrence probability of the circumjacent state y of "circumjancence" is also increased. Here, the circumjacent state that actually occurs is the circumjacent state x. Then, assuming that p(x)>p(y), the following expression holds.

$$n(x)-n(y) \leq \alpha \cdot n(x) \tag{9}$$

Therefore, the occurrence probability of the circumjacent state y may be increased by a value corresponding to the lower limit of the expression (9).

For the actual probability estimation, a transition table for probability estimation is used by the JBIG, for example. In the present embodiment, to realize the above algorithm, a counter for counting the number of occurrences for each circumjacent state is used, and an occurrence probability of a circumjacent state that occurs is calculated as required.

Accordingly, the algorithm in the present embodiment can mathematically be written by the following expression.

$$n(y)=n(x)-\alpha' \cdot n(x) \tag{10}$$

where n(x) and n(y) are the increments of the counter that correspond to the circumjacent states x and y. In the expression (10), α restricts the difference between the increments n. Therefore, it must be set to a value smaller than α in the expression (9).

If the expression (10) is recurrently repeated from "circumjancence" to another "circumjancence" of the former, then we have $$n(y)=n(x)-n(x)\cdot\alpha'\cdot[D(x,y)/d] \tag{11}$$

where [ ] indicates the operation of raising fractions to unit. In this case, the "circumjancence" of a "circumjancence" is handled as the "circumjancence" of itself. This new "circumjancence" is valid till the expression (111) takes a positive value.

It is noted here that the expression (6) does not have to be always satisfied to improve the coding efficiency. The end to be achieved here is to speed up the probability estimation. Hence, the essential matter is how to asymptotically approach to a probability distribution that seems to be approximate to the intended one as high as possible even if the result contains a slight error. Therefore, the right side of the expression (6) may be selected such that the expression (6) holds at a certain probability. Mathematically, it can be described by the following expression.

$$\text{Prob}(|p(x)-p(y)| \leq \alpha) \geq \beta \quad (0<\beta<1) \tag{12}$$

Figure 6:
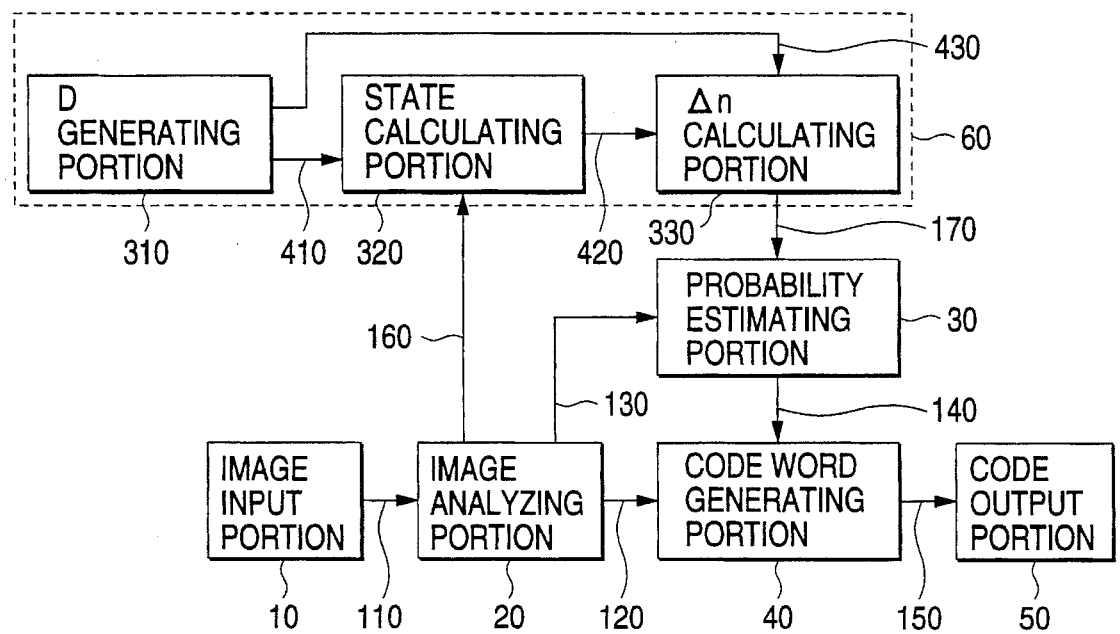
FIGS. 6 (a) and 6 (b) are block diagrams showing the embodiment of the present invention.
Figure 6:
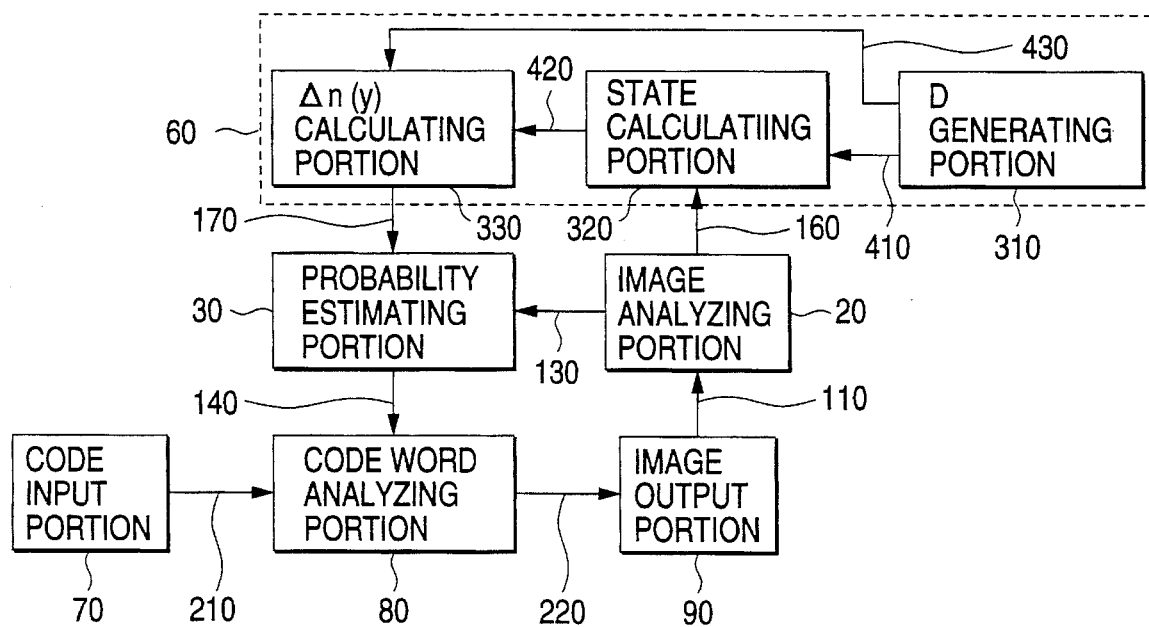

An arrangement of the present embodiment designed on the basis of the above-mentioned algorithm is shown in FIGS. 6 (a) and 6 (b). For simplicity, like or equivalent portions will be designated by like reference numerals in FIGS. 1 (a) and 1 (b). In the figures, reference numeral 310 designates a D generating portion; 320, a state calculating portion; 330, a n calculating portion; 410 and 430, D data; and 420, state data.

The details of the arrangements of FIGS. 6 (a) and 6 (b) will be described. In the description, the portions in FIGS. 6 (a) and 6 (b) that are equal or equivalent to those in FIGS. 1 (a) and 1 (b) are omitted. The D generating portion 310 sequentially generates integers that are not larger than the constant d in the algorithm, from 1, and transfers them as D data 410 and 430 to the state calculating portion 320 and the n calculating portion 330. The state calculating portion 320 substitutes the circumjacent state data 160 and the D data 410 into the expression (5), and generates all the circumjacent states y which satisfy the expression in successive order. The generated circumjacent states are transferred as the state data 420 to the n calculating portion 330. The n calculating portion 330 calculates n(y) by substituting the D data 430 into the expression (111). The result of the calculation is combined with the state data 420 coming from the state calculating portion 320, and the result is transferred as update data 170 to the probability estimating portion 30.

Figure 7:
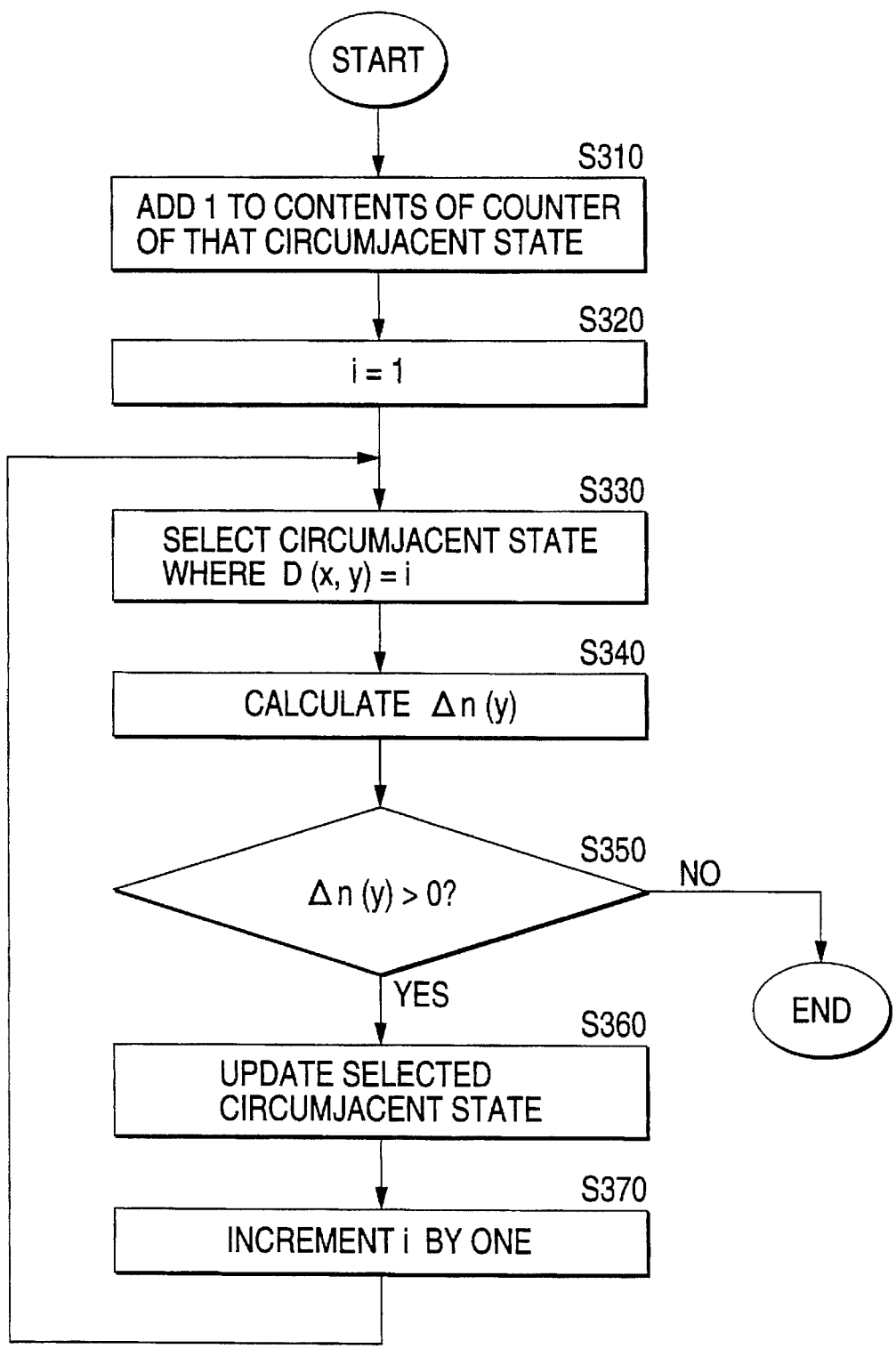
FIG. 7 is a flowchart showing the operation of the embodiment.

Next, the operation of the present embodiment will be described. FIGS. 2 (a) and 2 (b) show flowcharts for explaining the operation of the embodiment. FIG. 7 is a flowchart for explaining step S60 in FIGS. 2 (a) and 2 (b).

Only step S60 will be described with reference to FIG. 7 since the remaining steps are substantially equal to those already described. In step S310, the probability estimating portion 30 adds n(x) to the contents of the probability estimating counter that corresponds to the circumjacent state data 130. The n(x) may be 1 basically. If required, it may be a constant or a variable other than 1. In step S320, the D generating portion 310 initializes the counter contained therein. In step S330, a count of the D generating portion 310 is transferred as D data 410 and 430 to the state calculating portion 320 and the n calculating portion 330. The state calculating portion 320 substitutes the circumjacent state data 160 and the D data 410 into the expression (5), calculates circumjacent states satisfying the expression, and successively transfers them to the n calculating portion 330. In step S340, the n calculating portion 330 calculates n(y) by using the D data 430 and the expression (111). The result of the calculation is combined with the state data 420, and the result is transferred as the update data 170 to the probability estimating portion 30. In step S350, the process continues when n(y), calculated in step S340, is larger than 0, and the process ends when it is not larger than 0. In step 360, the probability estimating portion 30 adds the value calculated in step S340 to the state selected in step S330, on the basis of the update data 170. In step S370, the count i in the D generating portion 310 is incremented by one, and the flow returns to step S330.

The operation of the embodiment thus far made will be further described using specific examples. An example of the expression of the circumjacent state data 130 and 160 is shown in FIG. 8. The state data represents pixel values of the marked pixels and the adjoining pixels. An example of the expression of the probability estimation data in the probability estimating portion 30 is shown in FIG. 9. The rows of the table indicate the context, while the columns indicate the pixel values of the marked pixel. The data coincident with the context in the circumjacent state data 130 is selected from this table and is transferred as probability estimation data 140. An example of the expression of the update data 170 is shown in FIG. 10. As shown, update data is the combination of n(y) and a plurality of pieces of state data.

Figure 11:
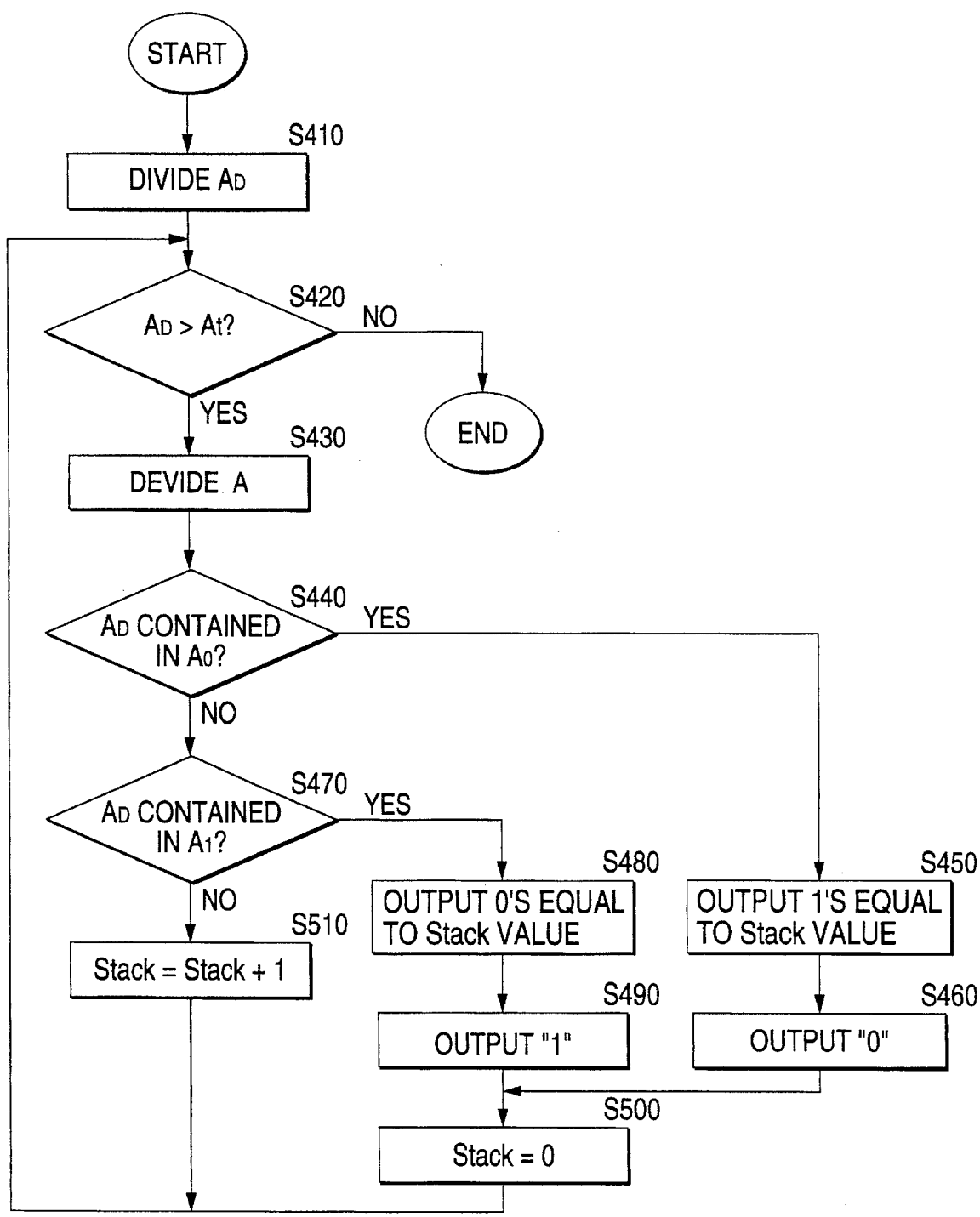
FIG. 11 is a flowchart showing a coding process in the embodiment.
Figure 12:
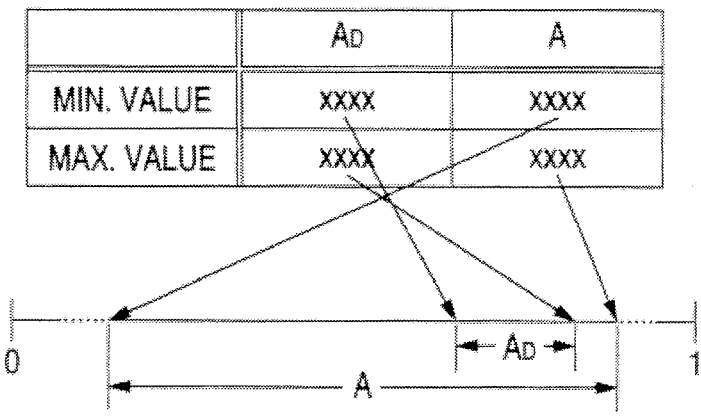
FIG. 12 is an explanatory diagram showing an example of the expression of the internal data in the embodiment.

In step S40, the multi-level arithmetic coding method, extended from the normal arithmetic coding method, is used. This process will be described using a flowchart of FIG. 11. Before proceeding with the description on this, it is assumed that the probability estimating portion 30 contains two data pieces A and AD representative of the width of the number line of (0, 1). An example of the expression of the data is shown in FIG. 12. In an initial state, the data A and AD represent the width of (0, 1). The data A represents the width indicated by an output code, and the data AD corresponds to the width determined by input data.

Figure 13:
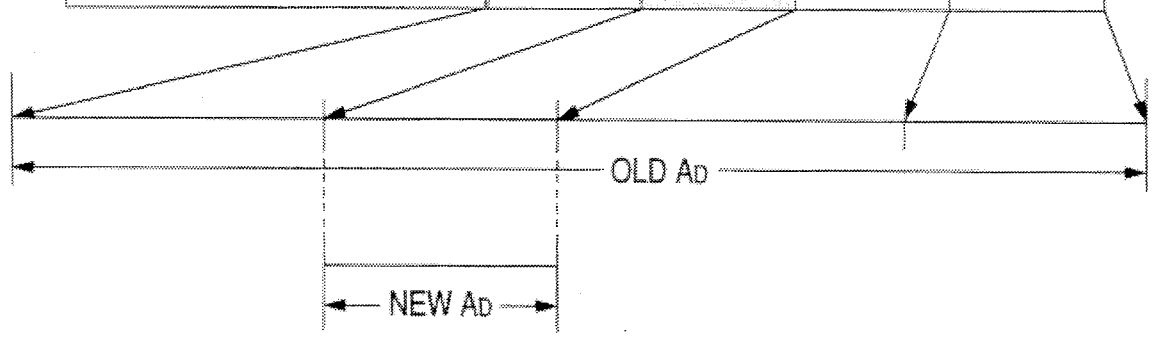
FIG. 13 is an explanatory diagram useful in explaining the coding process in the embodiment.

In step S410, the code word generating portion 40 divides the data AD at the same ratio as the probability estimation data 140. A portion corresponding to the pixel value data 120 is used as new data AD. A simple example of this process is shown in FIG. 13. In step S420, if AD at that time point is larger than a proper constant At (e.g., ½) contained in the interval (0, 1), the process ends. In step S430, A is divided into two at the mid point. The divided portion close to 0 is denoted as A0, while the divided portion close to 1 is denoted as A1. In step S440, if AD is contained in A0, 1's equal to a value of Stack are output as a code in step S450. Thereafter, in step S460, 0 is output. In step S470, if AD is contained in A1, 0's equal to a value of Stack are output as a code in step S480. Thereafter, in step S490, 1 is output. After executing step S460 or S490, step S500 is executed. In this step, Stack is reset to 0, and then the flow returns to step S240. If the answer to steps S440 and S470 is NO, step S510 is executed to increment the value of the stack by one, and the flow returns to step S240.

In addition to the above-mentioned process, at the terminal of the code, At is set to 1 and the code must be discharged to the last. The decoding process will easily be inferred from the analogy to the coding process as mentioned above. Hence, description of the decoding process is omitted here.

In the present embodiment, in step S310 in FIG. 7, n(x)=1, but it may be a variable. In this case, such a control that n(x)+Σn(y) is set within a fixed value may be used.

Finally, a means for further improving the efficiency of the present embodiment will be described. When handling a large image, sometimes the occurrence probabilities of the circumjacent states in a regional area of the same image are extremely different from those at another regional area. In such a case, if the probability estimation data in the probability estimating portion 30 is initialized, sometimes the probability estimation is done at high speed. Here, the term "initialization" means that the contents of the counter corresponding to the circumjacent state is set to 0 or reduced at a fixed rate. By this process, the probability estimation sensitively responds to subsequent input data.

In the initializing process, the timing of executing it must be determined carefully. The initializing process may be carried out every fixed number of pixels or every fixed number of lines. Alternatively, while monitoring the quantity of code for a predetermined number of pixels, the initializing process may be carried out when the quantity of code is increased.

As a modification of the present embodiment, the sum in the expression (5) may be replaced by the n-th power sum (n is a constant). In this case, D(x, y) is expressed by the following expression (5').

$$D(x,y)=(A_x A_y)^n+(B_x-B_y)^n+(X_x-X_y)^n \leq d, (d>0) \tag{5'}$$

Here, the right side of the expression (5') may be the n-th roof of it. Altering the definition of "circumjancence" in the expression (5), we have the following expression.

$$\begin{aligned} D(x,y) = &\ (|X_x - A_x| - |X_y - A_y|) + \\ &\ (|X_x - B_x| - |X_y - B_y|) + \\ &\ (|A_x - B_x| - |A_y - B_y|) \leq d \end{aligned} \tag{5''}$$

The expression (5'') will be effective for an image of which many regional areas are uniform in gradation. Thus, the "circumjancence" may flexibly be selected. In this case, the presumption of the expression (6) must be altered so as to conform to the "circumjancence" defined anew.

In the presumption of the expression (6), max (p(x), p(y)) is used in the right side thereof. If the right side is set at the constant for coping with the circumjacent states that occur at high frequency, sometimes the right side value is excessive in circumjacent states that occur at low frequency. It is for this reason that max (p(x), p(y)) is used in the right side. If required, the right side of the expression (6) may be set at the constant α. In this case, calculation load is reduced.

Figure 14:
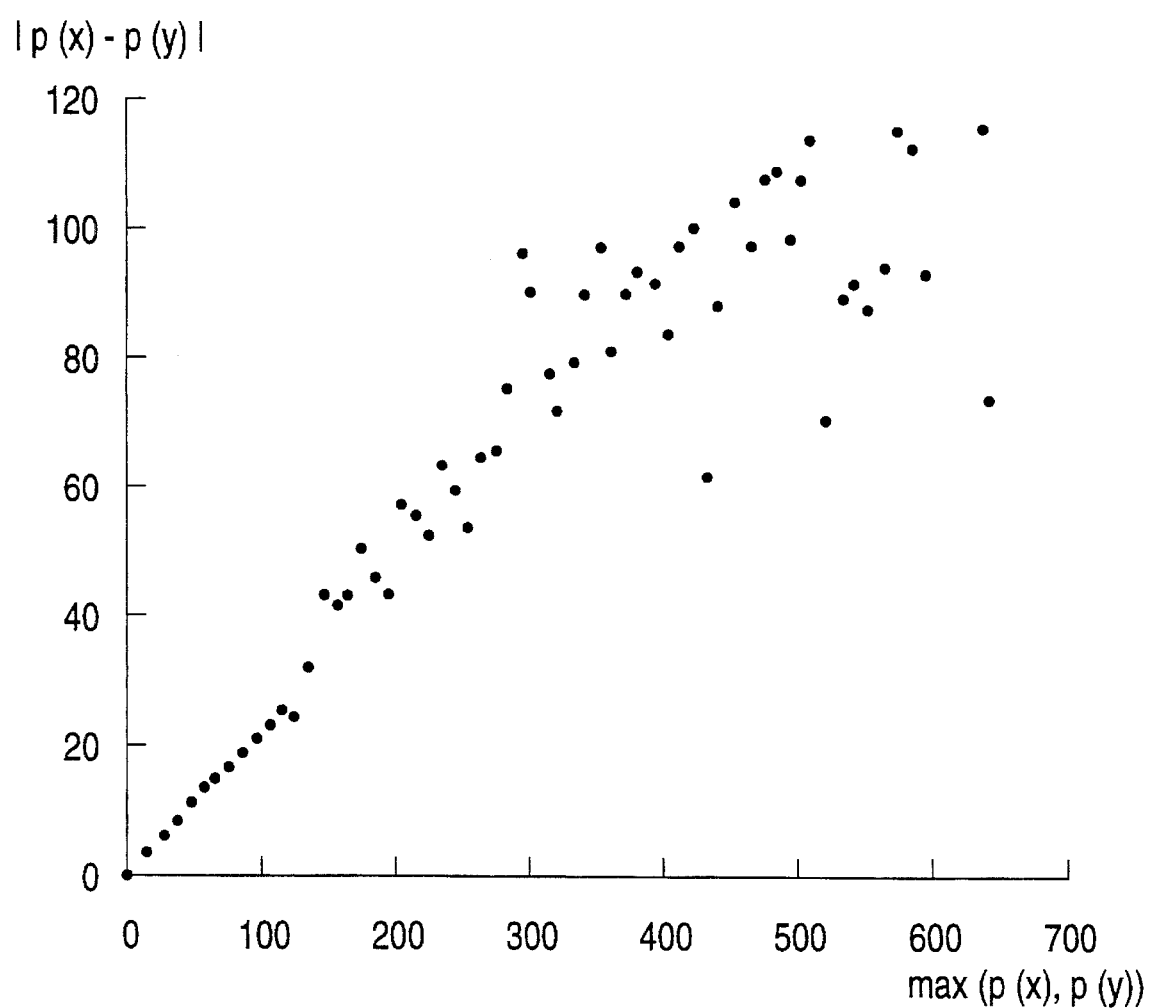
FIG. 14 is a graph showing the reasonability of the presumption in the embodiment.
Figure 15:
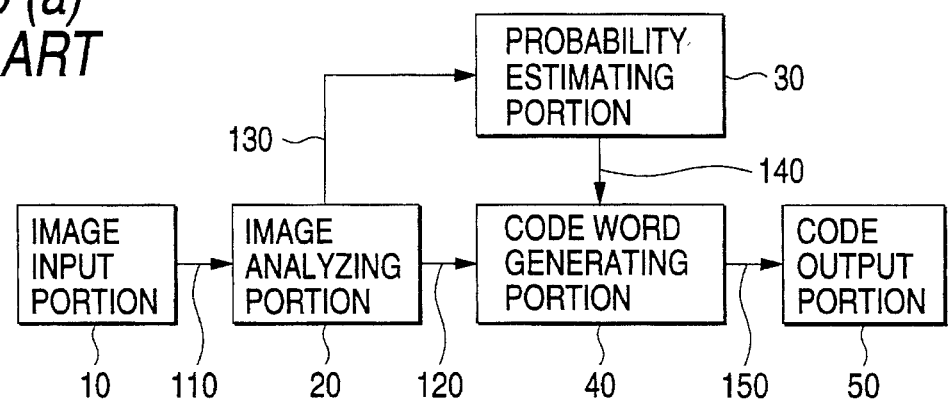
FIGS. 15 (a) and 15 (b) are block diagrams showing a conventional arithmetic coding/decoding system.
Figure 15:
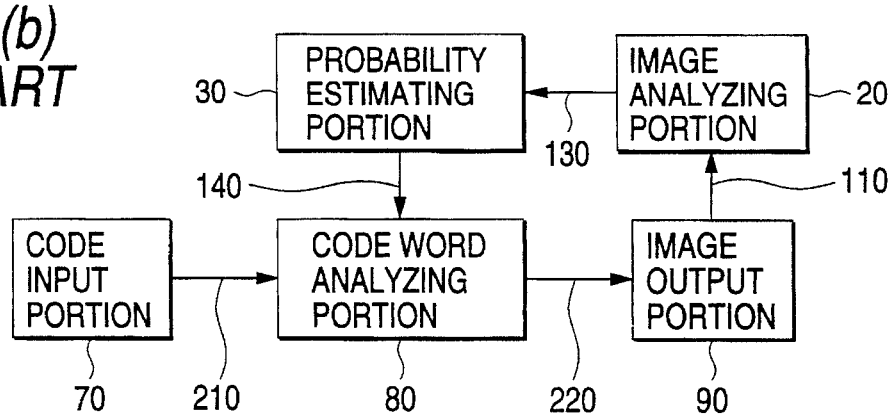
Figure 16:
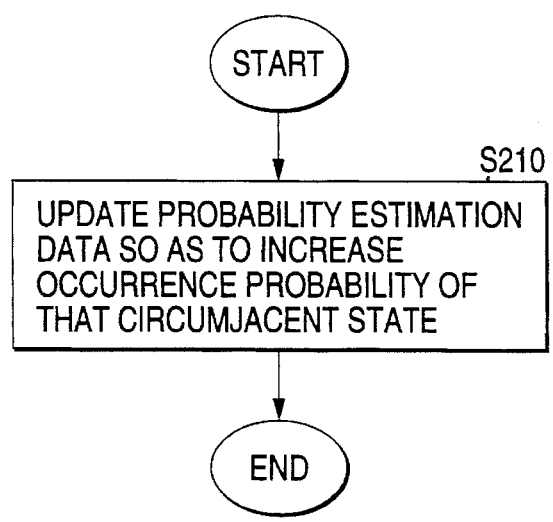
FIG. 16 is a flowchart showing the operation of the conventional arithmetic coding/decoding system.

The result of a simulation for proving the effects of the present embodiment will be described. To prove the reasonability of the presumption of the expression (6), an image was measured. The result of the measurement is plotted on a graph shown in FIG. 14. In the graph, the abscissa represents max(p(x), p(y)), and the ordinate, |p(x)−p(y)|. Collected data were properly grouped on the basis of the values of max(p(x), p(y)), and the average values of the resultant groups were plotted on the graph of FIG. 14. From the graph of FIG. 14, it is seen that the expression (6) has a certain reasonability.

Next, a simulation in which the coding efficiencies are measured will be described. The images used for the simulation were all scan-in images of 8 bits/pixel. The sizes of these images are as follows:

| Image 1 | 1024 [pixels] | 1024 [lines] |
| Image 2 | 1024 [pixels] | 1024 [lines] |
| Image 3 | 1600 [pixels] | 600 [lines] |
| Image 4 | 1024 [pixels] | 1024 [lines] |
| Image 5 | 1024 [pixels] | 1536 [lines] |
| Image 6 | 1024 [pixels] | 1536 [lines] |
| Image 7 | 1024 [pixels] | 1024 [lines] |

For the vehicle of comparison, the images were compressed by the JBIG bit plane method and a non-independent method as a reversible compression method used in JPEG (Joint Photographic Experts Group) as the standard for the image compression. In this simulation, the initializing process as described above was carried out. The results of this are shown in Table 2. The useful effects of the present embodiment will be seen from Table 2.

TABLE 2

|  | Embodiment | JPEG-independent | | JBIG-bit plane | |
| --- | --- | --- | --- | --- | --- |
|  | Coding efficiency A | Coding efficiency B | B/A | Coding efficiency C | C/A |
| Image 1 | 0.506489 | 0.624599 | 1.23319 | 0.614964 | 1.21417 |
| Image 2 | 0.524295 | 0.650355 | 1.24044 | 0.638818 | 1.21843 |
| Image 3 | 0.447504 | 0.515860 | 1.15275 | 0.608347 | 1.35942 |
| Image 4 | 0.472046 | 0.564770 | 1.19643 | 0.584186 | 1.23756 |
| Image 5 | 0.487035 | 0.521790 | 1.07136 | 0.630902 | 1.29539 |
| Image 6 | 0.539895 | 0.566522 | 1.04932 | 0.683769 | 1.26649 |
| Image 7 | 0.701976 | 0.798136 | 1.13698 | 0.805455 | 1.14741 |

As seen from the foregoing description, in the present invention, the occurrence probabilities of some circumjacent states may be updated for one piece of input data. Therefore, the speed-up of estimating the occurrence probability is realized. As a result, the coding efficiency is improved in the multi-level arithmetic coding.

When a specific circumjacent state of image data varies, the update value determining portion updates the probability estimation data on other circumjacent states existing circumjacent to the specific circumjacent state. As a result, the number of changes of the specific circumjacent state is apparently increased. Therefore, even in the arithmetic coding of multi-level image, the probability estimation data possessed by the arithmetic coding device may be made to quickly follow the probability estimation data best for actual image data. Therefore, the image data can be coded at high efficiency.

What is claimed is:

1. An image coding device comprising:

image analyzing means for analyzing an input multi-level image;

update value generating means for generating update information to be used when a probability estimation value is generated on the basis of adjoining pixel information as a result of the analysis by said image analyzing means;

probability estimating means for generating a probability estimation value on the basis of the update information generated by said update value generating means and the result of the analysis by said image analyzing means; and code word generating means for arithmetically coding the input multi-level image on the basis of the probability estimation value generated by said probability estimating means.

2. The image coding device according to claim 1, wherein said update value generating means generates update information to be used when a probability estimation value is generated on the basis of circumjacent information as a sum of pixel value differences of marked pixels and those of adjoining pixels, in the circumjacent states of the statistically processed multi-level image.

3. The image coding device according to claim 1, wherein said update value generating means generates update information to be used when a probability estimation value is generated on the basis of circumjacent information formed in a manner that pixel value differences between marked pixels and between adjoining pixels are calculated, and the values are compared between the circumjacent states, in the circumjacent states of the statistically processed multi-level image.

4. The image coding device according to claim 1, wherein said update value generating means generates update information to be used when a probability estimation value is generated, so that when the occurrence probabilities of the circumjacent states of the statistically processed multi-level image is greatly varied, the probability estimation value generated by said probability estimating means more sensitively responds to the variation.

5. An image decoding device comprising:

code word analyzing means for arithmetically coding input codes to decode the input codes;

image analyzing means for analyzing a multi-level image decoded by said code word analyzing means;

update value generating means for generating update information to be used when a probability estimation value is generated on the basis of adjoining pixel information as a result of the analysis by said image analyzing means; and probability estimating means for generating a probability estimation value on the basis of the update information generated by said update value generating means and the result of the analysis by said image analyzing means, wherein said code word analyzing means decodes the input codes on the basis of the probability estimation value generated by said probability estimating means.

6. The image decoding device according to claim 5, wherein said update value generating means generates update information to be used when a probability estimation value is generated on the basis of circumjacent information as a sum of pixel value differences of marked pixels and those of adjoining pixels, in the circumjacent states of the statistically processed multi-level image.

7. The image decoding device according to claim 5, wherein said update value generating means generates update information to be used when a probability estimation value is generated on the basis of circumjacent information formed in a manner that pixel value differences between marked pixels and between adjoining pixels are calculated, and the values are compared between the circumjacent states, in the circumjacent states of the statistically processed multi-level image.

8. The image decoding device according to claim 5, wherein said update value generating means generates update information to be used when a probability estimation value is generated, so that when the occurrence probabilities of the circumjacent states of the statistically processed multi-level image is greatly varied, the probability estimation value generated by said probability estimating means more sensitively responds to the variation.

9. An image coding/decoding system comprising:

first image analyzing means for analyzing an input multi-level image;

first update value generating means for generating update information to be used when a probability estimation value is generated on the basis of adjoining pixel information as a result of the analysis by said first image analyzing means;

first probability estimating means for generating a probability estimation value on the basis of the update information generated by said first update value generating means and the result of the analysis by said first image analyzing means;

code word generating means for arithmetically coding the input multi-level image on the basis of the probability estimation value generated by said first probability estimating means;

code word analyzing means for arithmetically coding codes formed through the arithmetic coding by said code word generating means to decode the codes;

second image analyzing means for analyzing the multi-level image decoded by said code word analyzing means;

second update value generating means for generating update information to be used when a probability estimation value is generated on the basis of adjoining pixel information as a result of the analysis by said second image analyzing means; and second probability estimating means for generating a probability estimation value on the basis of the update information generated by said second update value generating means and the result of the analysis by said second image analyzing means, wherein said code word analyzing means decodes the input codes on the basis of the probability estimation value generated by said second probability estimating means.

10. The image coding/decoding system according to claim 9, wherein said update value generating means generates update information to be used when a probability estimation value is generated on the basis of circumjacent information as a sum of pixel value differences of marked pixels and those of adjoining pixels, in the circumjacent states of the statistically processed multi-level image.

11. The image coding/decoding system according to claim 9, wherein said update value generating means generates update information to be used when a probability estimation value is generated on the basis of circumjacent information formed in a manner that pixel value differences between marked pixels and between adjoining pixels are calculated, and the values are compared between the circumjacent states, in the circumjacent states of the statistically processed multi-level image.

12. The image coding/decoding system according to claim 9, wherein said update value generating means generates update information to be used when a probability estimation value is generated, so that when the occurrence probabilities of the circumjacent states of the statistically processed multi-level image is greatly varied, the probability estimation value generated by said probability estimating means more sensitively responds to the variation.

13. An arithmetic coding device for coding image data by specifying probability estimation data to be used for coding a marked pixel, on the basis of the pixel values of adjoining pixels of the marked pixel, said arithmetic coding device comprising:

image input means for inputting multi-level image data;

image analyzing means for outputting the pixel values of specific adjoining pixels of the image data in the form of circumjacent state data;

update value determining means for determining an update value of the probability estimation data on the basis of the circumjacent state data, said update value determining means including setting means for setting a circumjacent area where occurrence of a specific circumjacent state of the image data varies other circumjacent states of the image data, and update value calculating means for calculating update values of the probability estimation data corresponding to the circumjacent states existing in the circumjacent area set by said setting means;

probability estimating means containing a number of probability estimation data associated with the circumjacent state data, and operating such that said probability estimating means selects specific probability estimation data on the basis of the circumjacent state data, and updates the selected probability estimation data by the update value determined by said update value determining means;

code word generating means for arithmetically coding the image data by using the updated probability estimation data when the updated probability estimation data is selected again by said probability estimating means on the basis of the circumjacent state data corresponding to the updated probability estimation data; and code output means for outputting code words generated by said code word generating means.

14. The arithmetic coding device according to claim 13, wherein said circumjacent area setting means of said update value determining means includes initial value generating means for calculating the circumjacent area, and state calculating means for specifying probability estimation data to be updated on the basis of the value from said initial value generating means and the value of the circumjacent state data.

15. The arithmetic coding device according to claim 13, wherein said circumjacent area setting means, the circumjacent area means a state that the correlation of an occurrence probability is high.

16. The arithmetic coding device according to claim 13, wherein the circumjacent area is determined on the basis of the difference between the pixel values of the marked pixel and the difference between the pixel values of the adjoining pixels.

17. The arithmetic coding device according to claim 13, wherein for the probability estimation data specified by said setting means of said update value determining means, said update value calculating means of said update value determining means increases the update value for the probability estimation data corresponding to the circumjacent state having a value approximate to the pixel value of the marked pixel of the specific circumjacent state, and said update value calculating means decreases the update value for the probability estimation data corresponding to the circumjacent state having a value greatly different from the pixel value of the marked pixel of the specific circumjacent state.

18. The arithmetic coding device according to claim 13, wherein for the probability estimation data specified by said setting means of said update value determining means, said update value calculating means of said update value determining means increases the update value for the probability estimation data corresponding to the circumjacent state having a value approximate to the sum of the difference between the pixel values of the marked pixels of the specific circumjacent state, and said update value calculating means decreases the update value for the probability estimation data corresponding to the circumjacent state having a value greatly different from the sum of the difference between the pixel values of the marked pixels of the specific circumjacent state.

19. An arithmetic decoding device which calculates circumjacent states of image data using adjoining pixels of the image data, and decodes code image data using probability estimation data corresponding to the circumjacent states, said arithmetic decoding device comprising:

image input means for inputting multi-level image data;

code word analyzing means for decoding received code data by an arithmetic coding;

image analyzing means for outputting as circumjacent state data the pixel values of specific adjoining pixels of the image data decoded by said code word analyzing means;

update value determining means for determining an update value of the probability estimation data on the basis of the circumjacent state data, said update value determining means including setting means for setting a circumjacent area where occurrence of a specific circumjacent state of the image data varies other circumjacent states of the image data, and update value calculating means for calculating update values of the probability estimation data corresponding to the circumjacent states existing in the circumjacent area set by said setting means;

probability estimating means containing a number of probability estimation data associated with the circumjacent state data, and operating such that said probability estimating means selects specific probability estimation data on the basis of the circumjacent state data, and updates the selected probability estimation data by the update value determined by said update value determining means; and code word generating means for arithmetically coding the image data by using the updated probability estimation data when the updated probability estimation data is selected again by said probability estimating means on the basis of the circumjacent state data corresponding to the updated probability estimation data, wherein said code word analyzing means decodes the code image data using the probability estimation data estimated by said probability estimating means.

20. The arithmetic decoding device according to claim 19, wherein said circumjacent area setting means of said update value determining means includes initial value generating means for calculating the circumjacent area, and state calculating means for specifying probability estimation data to be updated on the basis of the value from said initial value generating means and the value of the circumjacent state data.

21. The arithmetic decoding device according to claim 19, wherein said circumjacent area setting means, said circumjacent area means a state that the correlation of an occurrence probability is high.

22. The arithmetic decoding device according to claim 19, wherein the circumjacent area is determined on the basis of the difference between the pixel values of the marked pixel and the difference between the pixel values of the adjoining pixels.

23. The arithmetic decoding device according to claim 19, wherein for the probability estimation data specified by said setting means of said update value determining means, said update value calculating means of said update value determining means increases the update value for the probability estimation data corresponding to the circumjacent state having a value approximate to the pixel value of the marked pixel of the specific circumjacent state, and said update value calculating means decreases the update value for the probability estimation data corresponding to the circumjacent state having a value greatly different from the pixel value of the marked pixel of the specific circumjacent state.

24. The arithmetic decoding device according to claim 19, wherein for the probability estimation data specified by said setting means of said update value determining means, said update value calculating means of said update value determining means increases the update value for the probability estimation data corresponding to the circumjacent state having a value approximate to the sum of the difference between the pixel values of the marked pixels of the specific circumjacent state, and said update value calculating means decreases the update value for the probability estimation data corresponding to the circumjacent state having a value greatly different from the sum of the difference between the pixel values of the marked pixels of the specific circumjacent state.

* * * * *